US008213213B2

(12) United States Patent
Chang et al.

(10) Patent No.: US 8,213,213 B2
(45) Date of Patent: Jul. 3, 2012

(54) REFERENCE CURRENT GENERATOR FOR RESISTANCE TYPE MEMORY AND METHOD THEREOF

(75) Inventors: Meng-Fan Chang, Taichung (TW); Ku-Feng Lin, Taipei County (TW); Pi-Feng Chiu, Taipei County (TW)

(73) Assignee: National Tsing Hua University, Hsin-Chu (TW)

( * ) Notice: Subject to any disclaimer, the term of this patent is extended or adjusted under 35 U.S.C. 154(b) by 373 days.

(21) Appl. No.: 12/614,631

(22) Filed: Nov. 9, 2009

(65) Prior Publication Data

US 2011/0110140 A1 May 12, 2011

(51) Int. Cl.
*G11C 11/00* (2006.01)

(52) U.S. Cl. .................. 365/148; 365/158; 365/189.011

(58) Field of Classification Search .................. 365/148, 365/158, 189.011
See application file for complete search history.

(56) References Cited

U.S. PATENT DOCUMENTS 6,392,923 B1 5/2002 Naji
7,286,395 B2 10/2007 Chen et al.
2009/0201717 A1 * 8/2009 Maeda et al. ................ 365/148

* cited by examiner

*Primary Examiner* — Jason Lappas
(74) *Attorney, Agent, or Firm* — WPAT, P.C.; Anthony King

(57) ABSTRACT

A reference current generator for a resistance type memory and a method thereof is disclosed. The reference current generator comprises N parallel circuit sets. Each of the N parallel circuit sets is formed with at least one first reference element and second reference elements connected in parallel. The number of the first reference elements plus the number of the second reference elements is N. The resistance value of first reference elements (a first resistance value) is not equal to the resistance value of the second reference elements (a second resistance value). An equivalent resistance provided with a equivalent resistance value between the first and second resistance value is formed by connecting the N parallel circuit sets in series between an input terminal and output terminal. A reference current is outputted from the output terminal by applying an operation voltage to the input terminal.

8 Claims, 13 Drawing Sheets

REFERENCE CURRENT GENERATOR FOR RESISTANCE TYPE MEMORY AND METHOD THEREOF

BACKGROUND OF THE INVENTION (a) Field of the Invention

The present invention relates to a reference current generator for a resistance type memory and a method thereof, and more particularly to a generator capable of generating an accurate and reliable reference current and a method thereof.

(b) Description of the Prior Art

Currently, a typical memory is comprised of a plurality of memory cells. Each memory cell is utilized to store 1-bit data, and the data state may be written to or read out from the cell. Different resistance values of the memory cell correspond to different logic states of the stored data. In a non-volatile memory, it is necessary to provide a current source or a voltage source to a selected memory cell during reading of data from the memory. The logic states of data stored in the memory cell is determined by the output sense current. However, due to the non-uniformity of semiconductor manufacturing process, the characteristics of memory cells in memory are different from each other so that their resistance values are changed and the sense current values are also shifted, which leads to incorrect interpretation. Therefore, the logic states of data stored in a memory cell are often determined by the comparison of the sense currents with reference currents generated by a reference current generator.

Referring to FIG. 1, a schematic view showing sense current distributions of two logic states of a stored datum is illustrated. In this figure, the abscissa represents the magnitude of the sense current and the ordinate represents the number of memory cells corresponding to the sense currents correspond. Generally, the distribution of memory cells is a Gaussian distribution as shown in the figure. When the resistance value of a memory cell is Rmax, the logic state of the corresponding data is 0 and the sense current is $I_0$. When the resistance value of a memory cell is Rmin, the logic state of the corresponding data is 1 and the sense current is $I_1$. Iref represents a reference current. When the resistance value of a memory cell varies, the corresponding sense current also varies within a certain range. Therefore, it is necessary to determine the logic state of read data by the comparison of the sense current with a reference current. When the sense current is less than Iref, the resistance value of the memory cell is around Rmax. As a result, the logic state is determined as 0. When the sense current is greater than Iref, the resistance value of the memory cell is around Rmin As a result, the logic state is determined as 1.

Referring to both FIGS. 2A and 2B, there are illustrated a graphical representation illustrating the relationship of various resistances discussed and a schematic view showing a midpoint resistance generator according to the prior art of U.S. Pat. No. 6,392,923. In a memory cell, an element with a maximum resistance value (Rmax) is connected in series with an element with a minimum resistance value (Rmin) to form a series circuit. Then, two series circuits are connected in parallel to obtain an equivalent midpoint resistance (Rmid) with a resistance value of (Rmax+Rmin)/2. The current passing through the generator is not a midpoint current. Thus it is unsuitable for the operation for utilizing the output current value as a reference for determining the logic state, but is only suitable for the operation for utilizing the output voltage value as a reference for determining the logic state.

In another prior art patent, U.S. Pat. No. 7,286,395 discloses two memory cells with different resistance characteristics (Rmax, Rmin) are connected in parallel to obtain an equivalent resistance Rmax//Rmin The generator becomes a midpoint current generator by averaging the output currents passing through the generator. However, the generator has a poor resistance capability against resistance variations caused by semiconductor manufacturing process.

SUMMARY OF THE INVENTION

In view of the aforementioned problems of the prior art, one object of the present invention is to provide a reference current generator for a resistance type memory for generating a reference current signal compared with the sense current passing through a non-volatile memory thereby avoiding incorrect determination caused by the difference between of each memory cell of the non-volatile memory due to semiconductor manufacturing process.

According to another object of the present invention reference current generator for a resistance type memory is provided, comprising N parallel circuit sets, where N is an integer greater than 1, each of the N parallel circuit sets is formed with at least one first reference element and at least one second reference element in parallel to each other. The number of the first reference elements plus the number of the second reference elements is N in each parallel circuit set. Each first reference element has a first resistance value and each second reference element has a second resistance value different from the first resistance value. N parallel circuit sets are connected in series between an input terminal and an output terminal to form an equivalent resistance whose resistance value is between the first resistance value and the second resistance value. A reference current is outputted from the output terminal by applying an operation voltage to the input terminal. The N parallel circuit sets are connected in series between the input terminal and the output terminal so that the inherent variation of characteristics among the reference elements in the generator is corrected to provide a more accurate reference current.

Wherein, the first reference element and the second reference element each is formed with a non-volatile resistance element and a switching transistor connected in series.

Wherein, the generator further comprises N control terminals, and each control terminals is respectively connected to a gate of the switching transistor of each first reference elements and each second reference elements in each parallel circuit sets to provide N bias voltages correspondingly.

When the number of the first reference elements is equal to the number of the second reference elements, the resistance value of the resulted equivalent resistance is between the first resistance value and the second resistance value. The value of current passing through the equivalent resistance is a midpoint between the current values sensed by the first reference element and the second reference element.

Furthermore, the present invention provides a method for generating a reference current for a resistance type memory comprising the following steps. First, a parallel circuit set is provided by connecting at least one first reference element whose resistance value is a first resistance value and at least one second reference element whose resistance value is a second resistance value in parallel with each other, wherein the first resistance value is not equal to the second resistance value. The above procedure is repeated to form parallel circuit sets. The number of the first reference elements plus the number of the second reference elements is N in each parallel circuit. An equivalent resistance having a equivalent resistance value between the first resistance value and the second resistance value is provided by connecting the N parallel circuit sets in series between an input terminal and an output terminal. Finally, a reference current is outputted from the output terminal by applying an operation voltage to the input terminal.

As described above, the reference current generator for a resistance type memory and the method thereof according to the present invention may have the following advantages:

(1) The reference current generator may generate a reference current signal compared with the sense current passing through a non-volatile memory thereby avoiding incorrect determination caused by the difference between of each memory cell of the non-volatile memory due to semiconductor manufacturing process.

(2) The reference current generator may correct the inherent variation of characteristics among the reference elements in the generator by the series connection of N parallel circuit sets to provide a more accurate reference current.

DETAILED DESCRIPTION OF THE PREFERRED EMBODIMENTS

The present invention discloses a reference current generator for a resistance type memory, comprising N parallel circuit sets, where N is an integer greater than 1, are connected in series between an input terminal and an output terminal to provide an equivalent resistance. Then, a reference current is outputted from the output terminal by applying an operation voltage to the input terminal.

Each parallel circuit sets is formed with at least one first reference element whose resistance value is a first resistance value and at least one second reference element whose resistance value is a second resistance value connected in parallel with each other. The number of the first reference elements plus the number of the second reference elements is N in each parallel circuit.

Wherein, the equivalent resistance value is between the first resistance value and the second resistance value.

Figure 1:
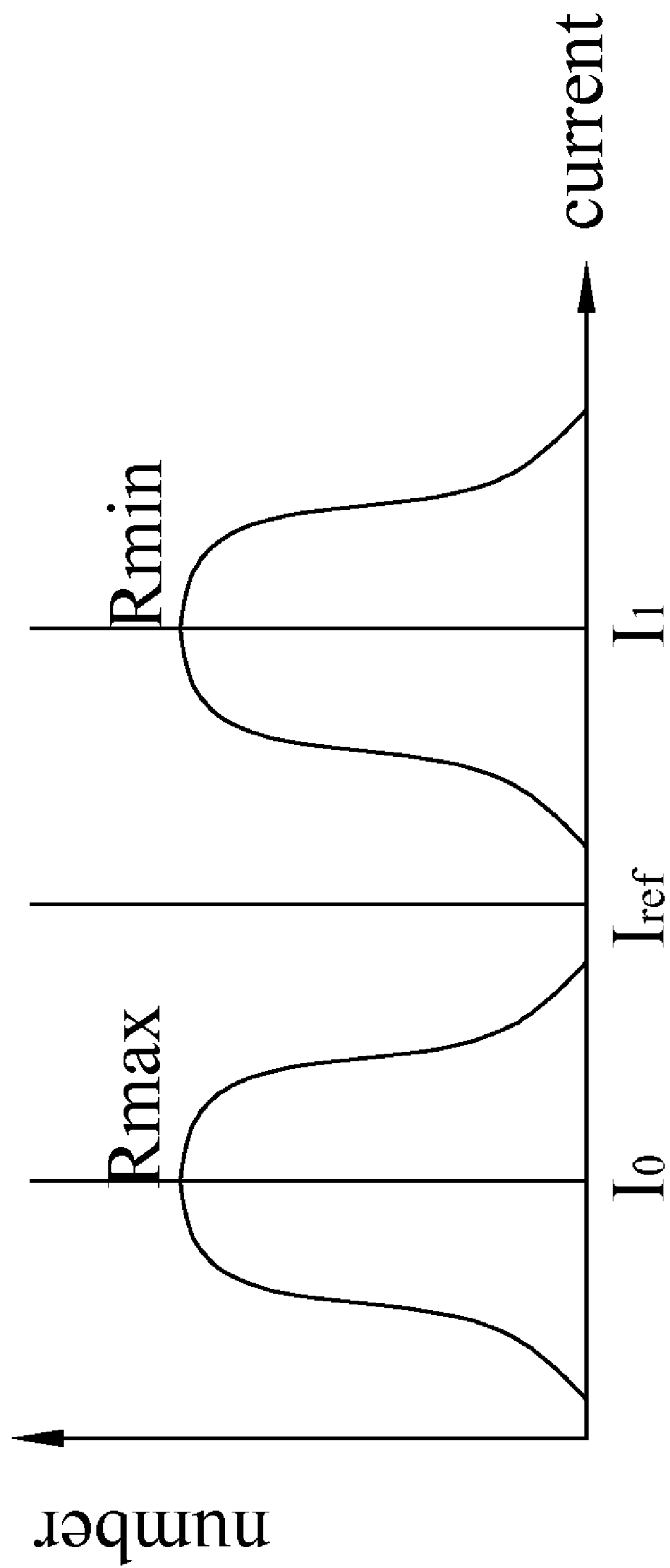
FIG. 1 is a schematic view showing sense current distributions of two logic states of a stored datum according to the present invention.
Figure 2A:
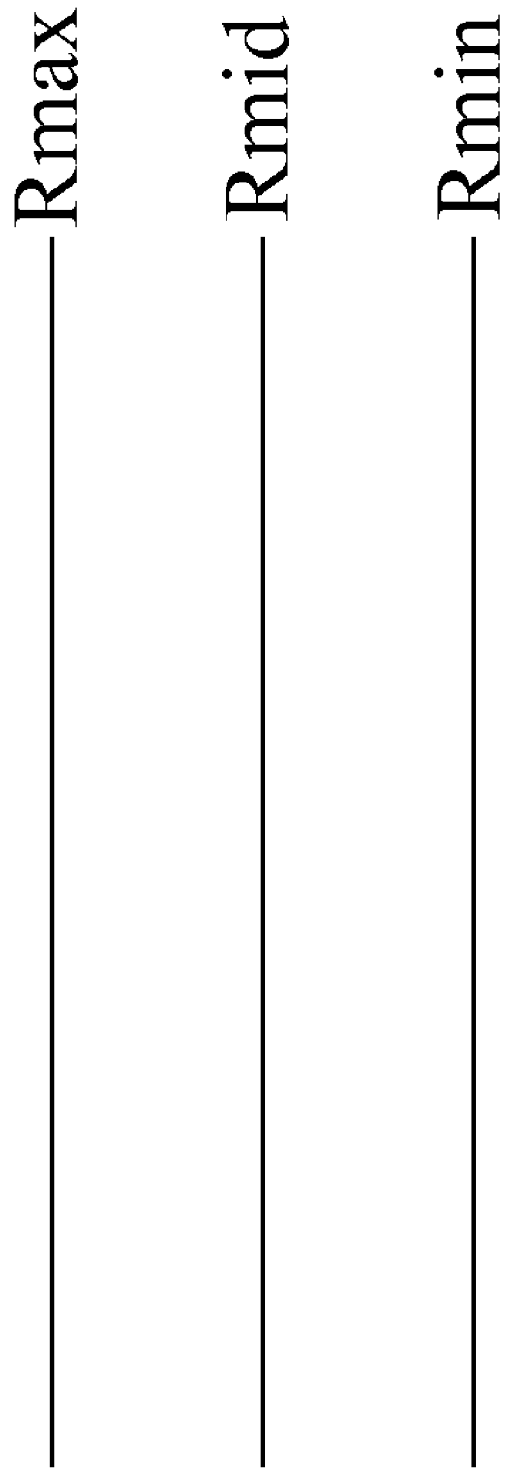
FIG. 2A is a graphical representation illustrating the relationship of various resistances discussed.
Figure 2B:
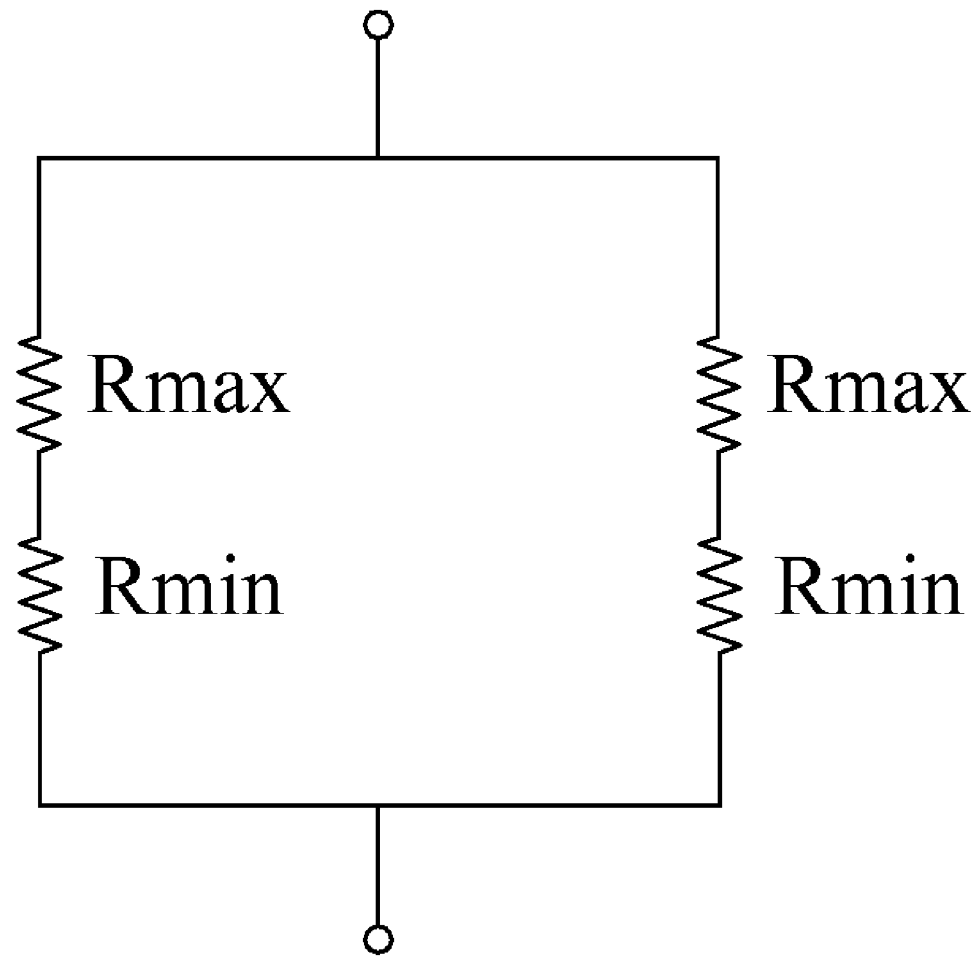
FIG. 2B is a schematic view showing a midpoint resistance generator according to the prior art.
Figure 3:
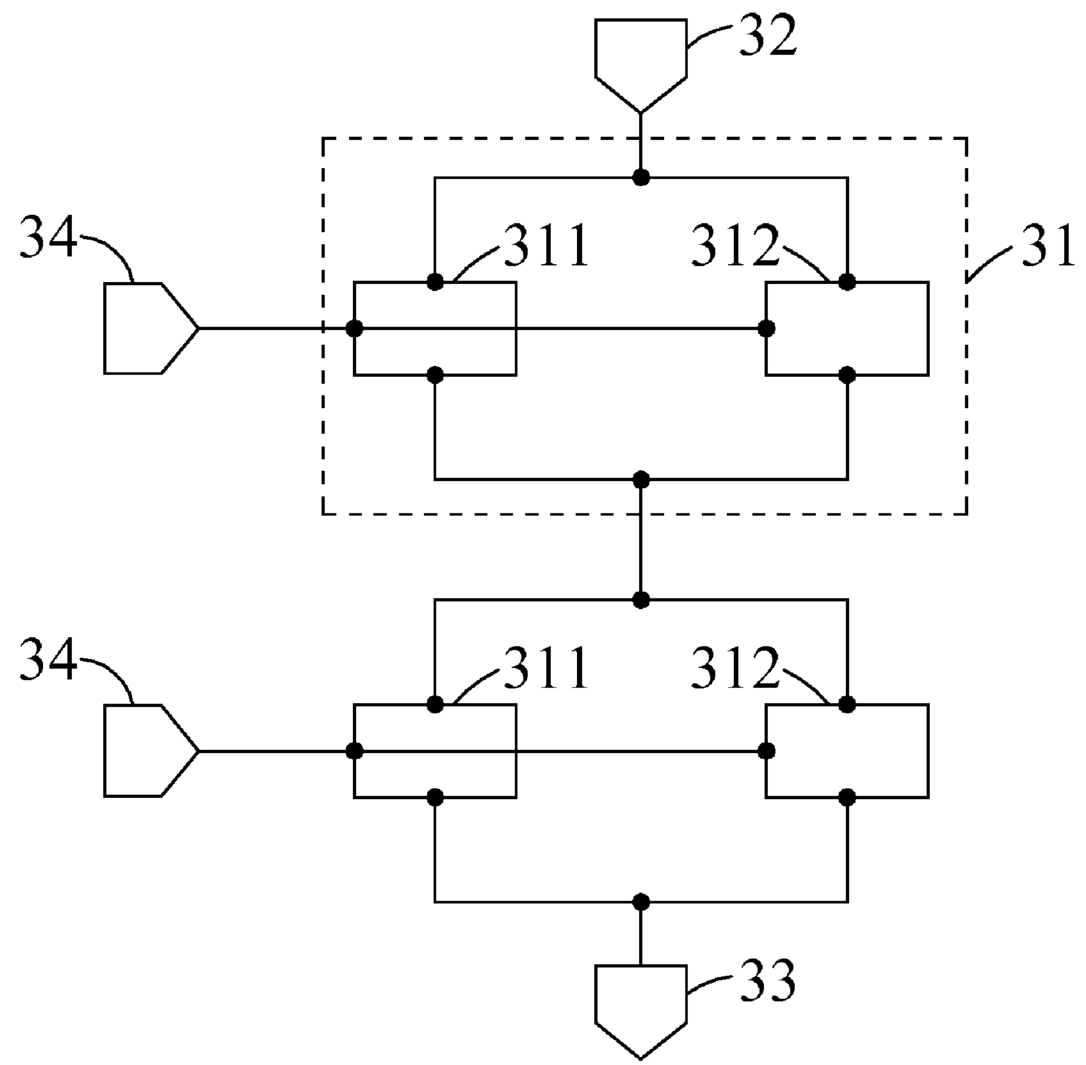
FIG. 3 is a schematic view of a first embodiment of a reference current generator for a resistance type memory according to the present invention.
Figure 4A:
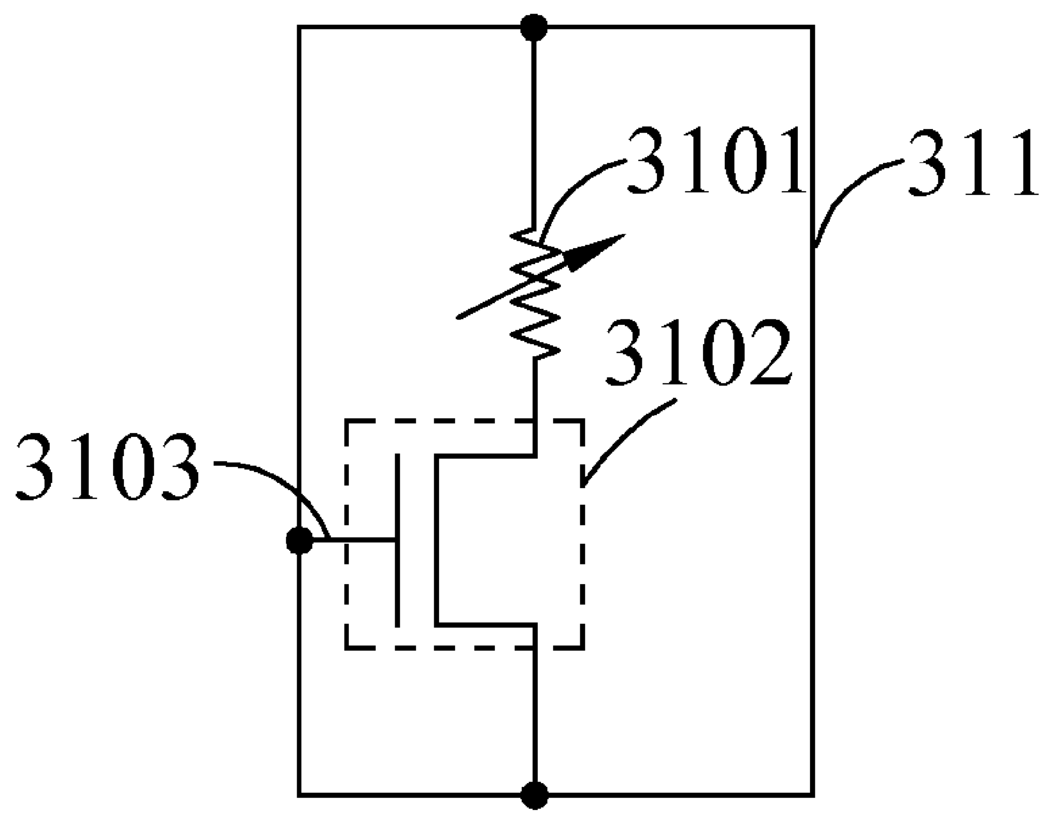
FIG. 4A is a schematic view showing a first reference element under forward bias voltage according to the present invention.
Figure 4B:
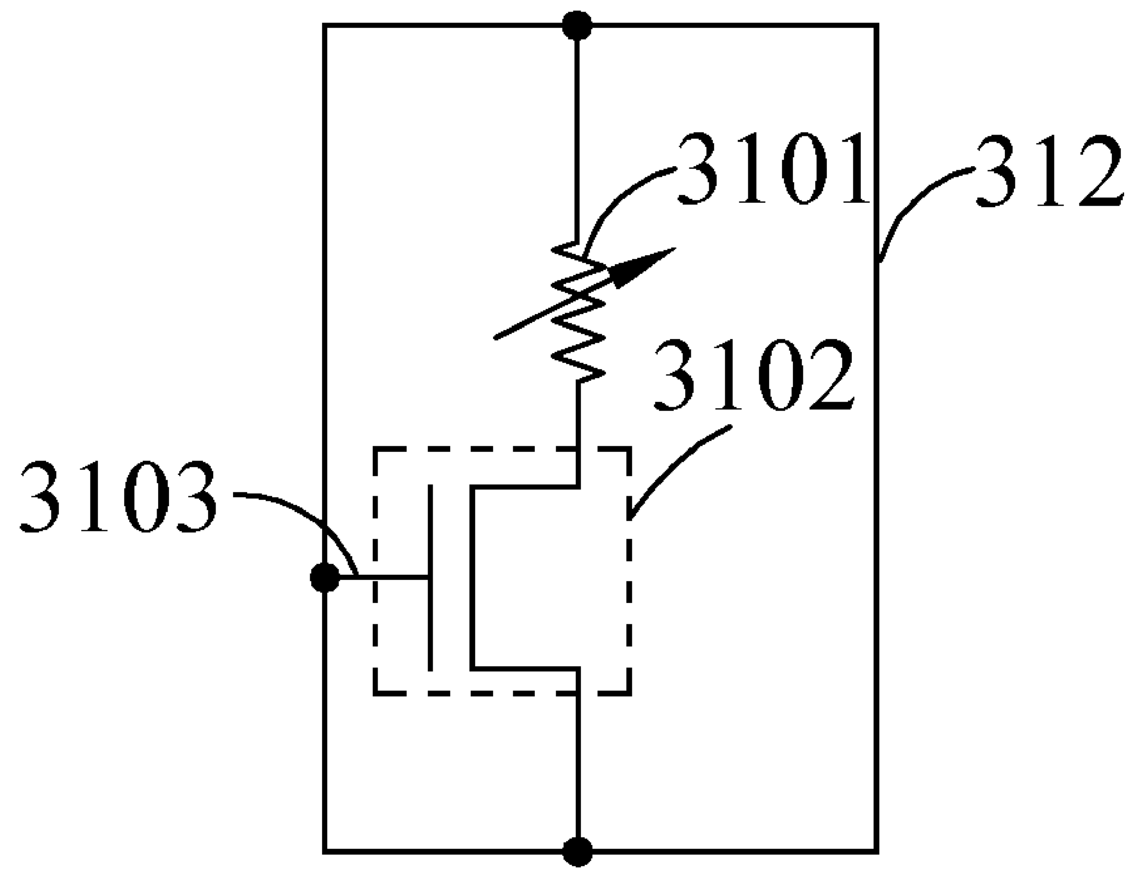
FIG. 4B is a schematic view showing a second reference element under forward bias voltage element according to the present invention.
Figure 4C:
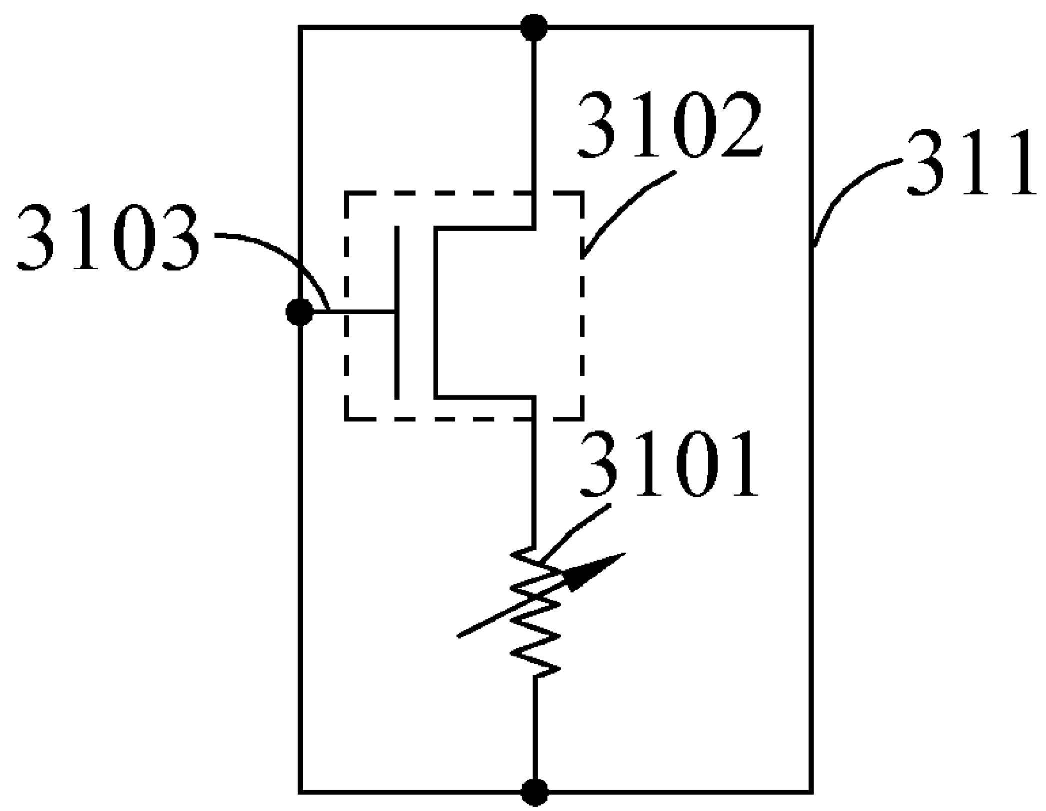
FIG. 4C is a schematic view showing a first reference element under reversed bias voltage according to the present invention.
Figure 4D:
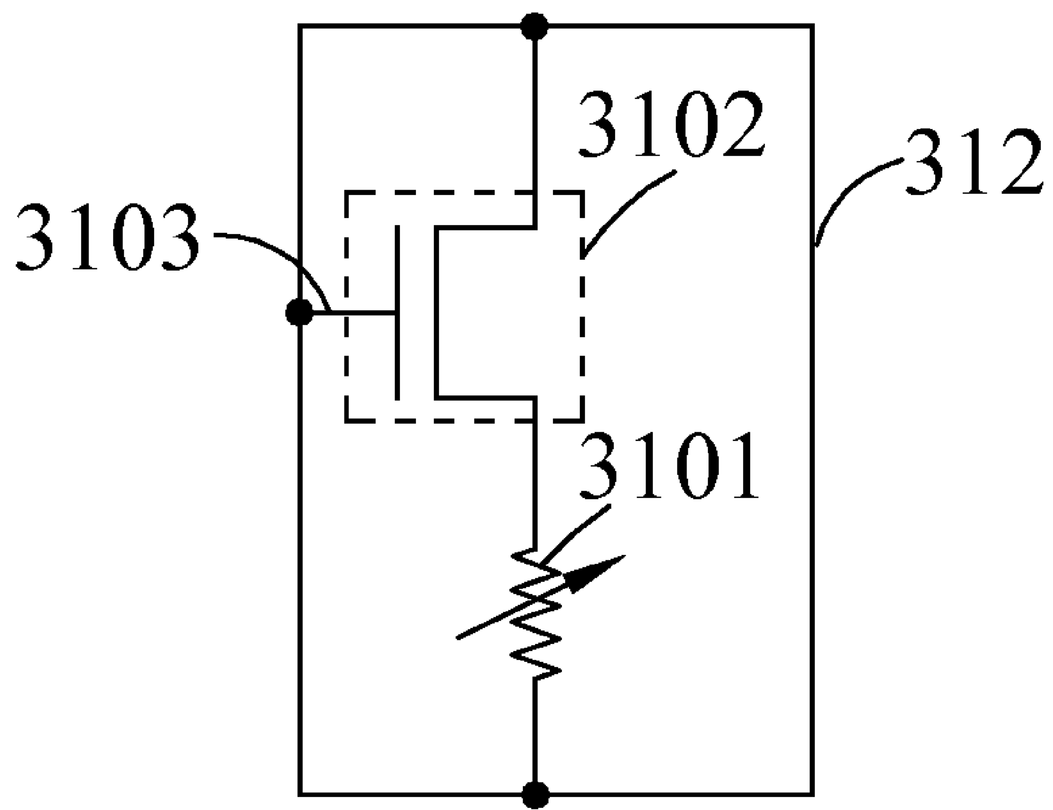
FIG. 4D is a schematic view showing a second reference element under reversed bias voltage according to the present invention.

Referring to FIG. 3, a schematic view of a first embodiment of a reference current generator for a resistance type memory according to the present invention is illustrated. In this figure, the reference current generator for a resistance type memory comprises two parallel circuit sets (31), an input terminal (32), an output terminal (33), and two control terminals (34). Each of the two parallel circuit sets (31) is formed with a first reference element (311) and a second reference element (312) connected in parallel with each other. The resistance value of each first reference elements (311) is a first resistance value (R1), and the resistance value of each second reference elements (312) is a second resistance value (R2), and wherein R1 is greater than R2. An equivalent resistance (Re) is provided by connecting the two parallel circuit sets (31) in series between the input terminal (32) and the output terminal (33), and Re is between R1 and R2. Then, a reference is outputted from the output terminal (33) by applying an operation voltage to the input terminal (32). Also referring to FIGS. 4A, 4B, 4C and 4D, there are illustrated a schematic view showing a first reference element under forward bias voltage, a schematic view showing a second reference element under forward bias voltage, a schematic view showing a first reference element under reversed bias voltage, and a schematic view showing a second reference element under reversed bias voltage. In these figures, each of the first reference element (311) and the second reference element (312) are formed with a variable resistance element (3101) and a switching transistor (3102) connected in series. Each two control terminals (34) is connected to the gate (3103) of each switching transistor in each of the parallel circuit sets (31), so as to provide the bias voltages required by the two parallel circuit sets. The bias voltage values may be the same or different from each other. When the variable resistance element (3101) is connected in series to the switching transistor (3102) as illustrated in FIGS. 4A and 4B, a forward bias voltage is provided by each of the control terminals (34). When the switching transistor (3102) is connected in series to the variable resistance element (3101) as illustrated in FIGS. 4C and 4D, a reversed bias voltage is provided by each of the control terminals (34).

When an operation voltage is applied to the first reference element (311), a current $I_1$ is generated. When an operation voltage is applied to the second reference element (312), a current $\mathbf{1}_2$ is generated. The generated reference current in the first embodiment is a midpoint current having a current value of $(1_1+I_2)/2$. This reference current may be used to compare with a sense current. If the sense current is greater than the reference current, it means that a logic state of stored data in a memory cell corresponds to a state at a smaller resistance value. If the sense current is less than the reference current, it means that a logic state of stored data in a memory cell corresponds to a state at a larger resistance value.

If the resistance values of the first reference element and the second reference element are 5 KΩ and 8 KΩ respectively as well as the operation voltage is 0.3 V, the currents passing through the first reference element (311) and the second reference element (312) are 37.5 μA ($I_1$) and 60 μA ($I_2$) respectively. The ideal midpoint current value is 48.75 μA. In the prior art of U.S. Pat. No. 6,392,923, the generated equivalent resistance is about 6.5 KΩ, and the reference current value is 46.15 μA different from the ideal midpoint current value. The generated equivalent resistance in the first embodiment is about 6.15 KΩ, and the reference current value is 48.75 μA as same as the ideal midpoint current value. Further, it is assumed that the resistance variation between the reference elements is 1 KΩ, i.e. the resistance value of the first reference element (311) ranging from 4 to 6 KΩ and the resistance value of the second reference element (312) ranging from 7 to 9 KΩ. Compared to the prior art of U.S. Pat. No. 7,286,395, the generated equivalent resistance is between 2.55 and 3.6 KΩ, and the reference current value is 118 to 83 μA. The value of the reference current generated by this method is $I_1+I_2$. If it is desired to compare with $I_1$ or $\mathbf{1}_2$, the value of the reference current must be reduced to a half, $(I_1+I_2)/2$. So, the reference current value is 59 to 41.5 μA. The generated equivalent resistance in the first embodiment is between 5.58 and 6.68 KΩ, and the reference current value is between 44.9 and 53.7 μA. Therefore, the generated reference current in the first embodiment has a more dense distribution than the reference current generated in the prior art under a condition of the same resistance variation. Namely, the reference current generator for a resistance type memory according to the present invention has a better resistance capability against resistance variations to provide an exact read and determination function to a memory.

Figure 5:
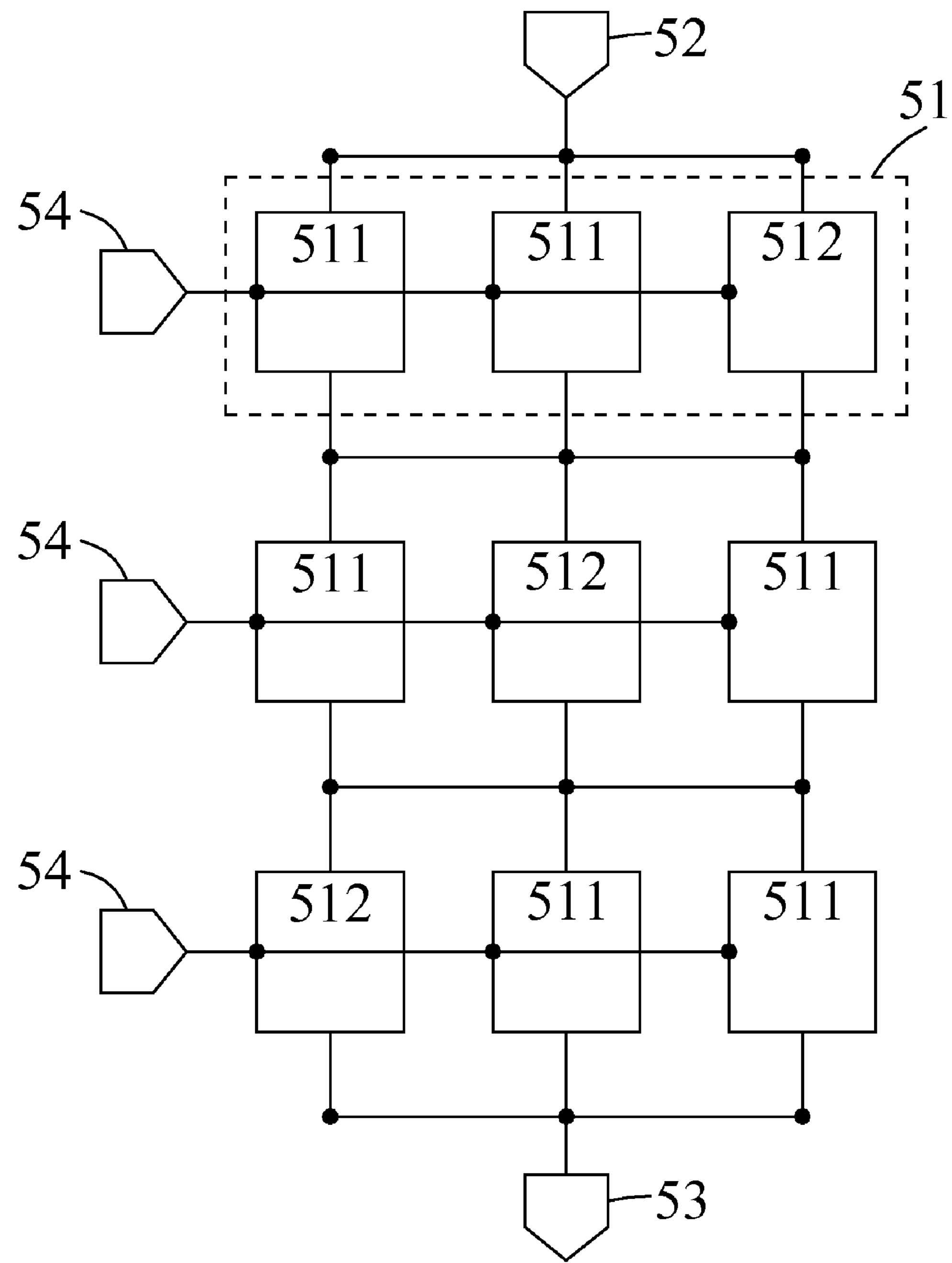
FIG. 5 is a schematic view of a second embodiment of a reference current generator for a resistance type memory according to the present invention.

Referring to FIG. 5, a schematic view of a second embodiment of a reference current generator for a resistance type memory according to the present invention is illustrated. Compared to the first embodiment, the difference lies in that there are three parallel circuit sets (51). Each of parallel circuit sets (51) is formed with two first reference elements (511) and a second reference element (512) connected in parallel with each other. Three control terminals (54) are respectively connected to the gates of switching transistors in the parallel circuit sets (51), so as to provide the bias voltages required by the respective three parallel circuit sets (51).

When an operation voltage is applied to the first reference element (511), a current $I_1$ is generated. When an operation voltage is applied to the second reference element (512), a current $I_2$ is generated. The generated reference current in this embodiment has a current value of $(2I_1+I_2)/3$. If each of the parallel circuit sets (51) is formed with a first reference element (511) and two second reference elements (512) connected in parallel with each other, the generated reference current value is $(I_1+2I_2)/3$. According to these two different reference current values, the adjustment of a sensing margin may be optimized or three different logic states of data may be interpreted.

Figure 6:
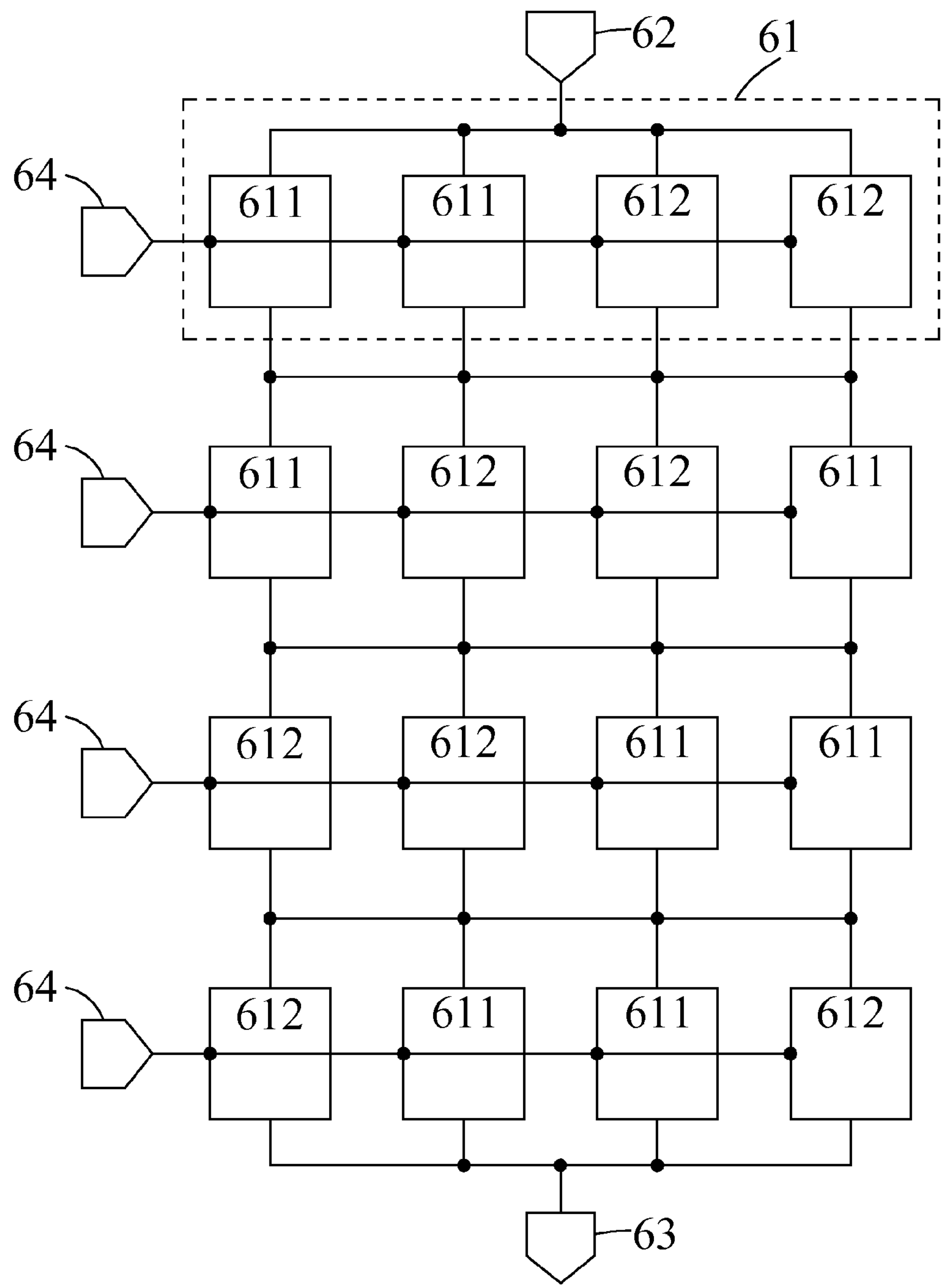
FIG. 6 is a schematic view of a third embodiment of a reference current generator for a resistance type memory according to the present invention.

Referring to FIG. 6, a schematic view of a third embodiment of a reference current generator for a resistance type memory according to the present invention is illustrated. Compared to the first embodiment, the difference lies in that there are four parallel circuit sets (61). Each parallel sets (61) is formed with two first reference elements (611) and two second reference elements (612) connected in parallel with each other. Four control terminals (64) are respectively connected to the gates of switching transistors in the parallel circuit sets (61), so as to provide the bias voltages required by the respective four parallel circuit sets (61).

The generated reference current in the third embodiment is the same as that in the first embodiment. The reference current is a midpoint current having a current value of $(I_1+I_2)/2$. But there is a more dense distribution of the generated reference currents in the third embodiment so that the generator has a better resistance capability against resistance variations to allow a memory to perform exact reading and determination.

Figure 7:
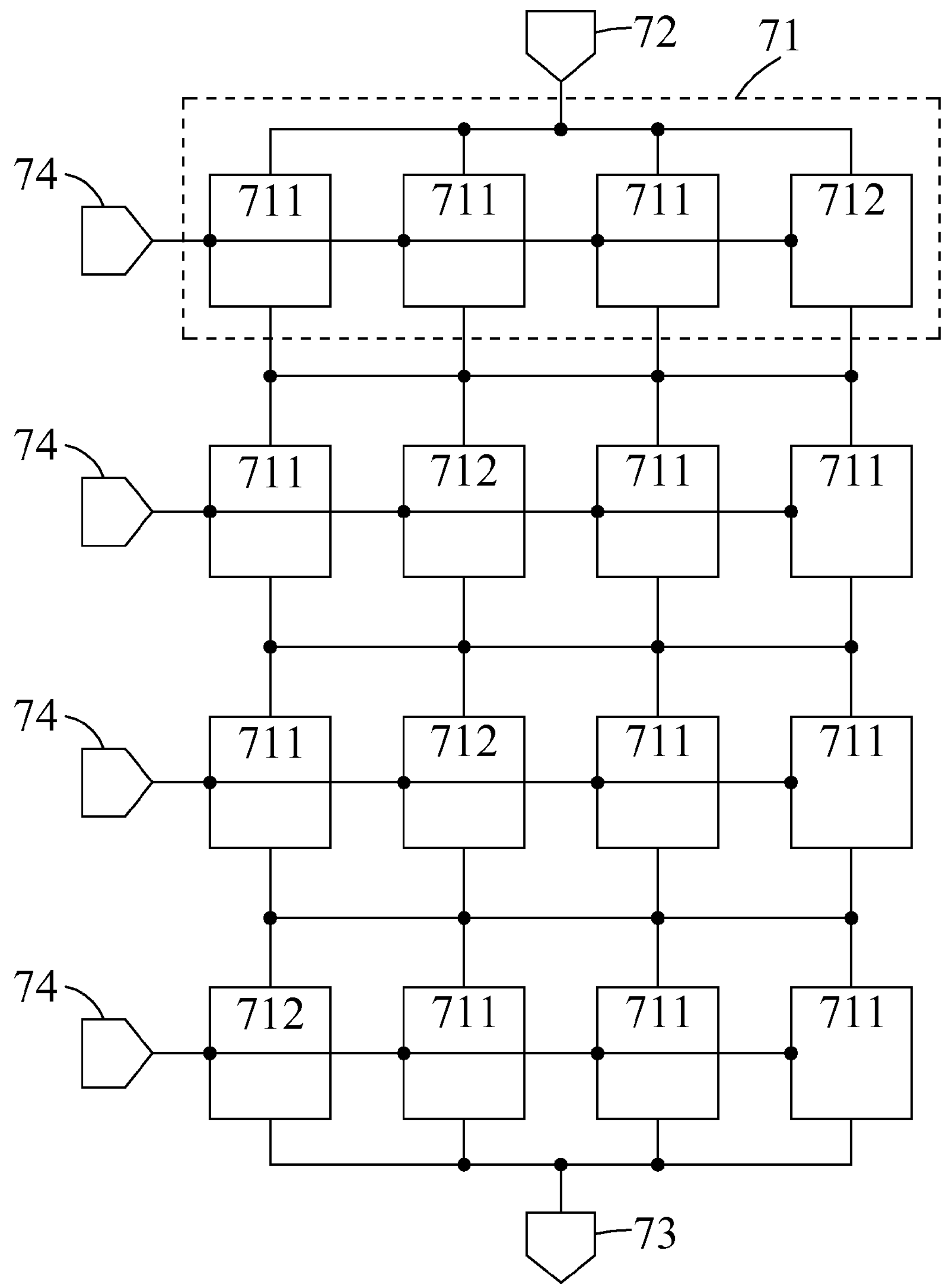
FIG. 7 is a schematic view of a fourth embodiment of a reference current generator for a resistance type memory according to the present invention.

Referring to FIG. 7, a schematic view of a fourth embodiment of a reference current generator for a resistance type memory according to the present invention is illustrated. Compared to the third embodiment, the difference lies in that each of the parallel circuit sets (71) is formed with three first reference elements (711) and a second reference elements (712) connected in parallel with each other. The resulted equivalent resistance value is also different from the equivalent resistance value in the third embodiment.

The generated reference current in the fourth embodiment has a current value of $(3I_1+I_2)/4$. But if each the parallel circuit sets (71) is formed with a first reference element (711) and three second reference elements (712) connected in parallel with each other, as well as two first reference elements (711) and two second reference elements (712) connected in parallel with each other, the generated reference current values are $(I_1+3I_2)/4$ and $(2I_1+2I_2)/4$, in sequence. According to the three different reference current values, the adjustment of a sensing margin may be optimized or four different logic states of data may be interpreted.

Figure 8:
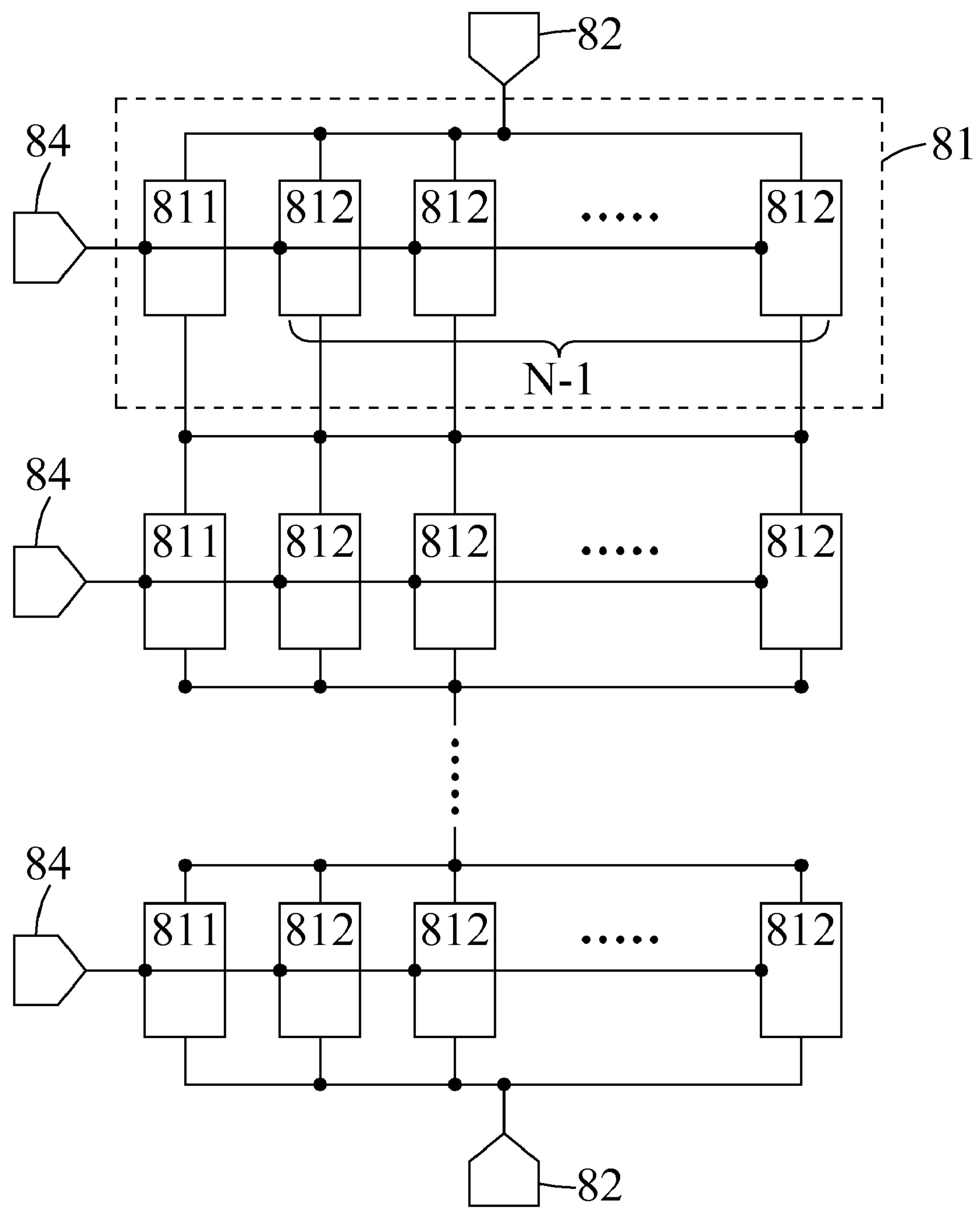
FIG. 8 is a schematic view of a fifth embodiment of a reference current generator for a resistance type memory according to the present invention.

Referring to FIG. 8, a schematic view of a fifth embodiment of a reference current generator for a resistance type memory according to the present invention is illustrated. Compared to the first embodiment, the difference lies in that there are N parallel circuit sets (81), each of which is formed with a first reference element (811) and (N−1) second reference elements (812) connected in parallel with each other. N control terminals (84) are respectively connected to the gates of switching transistors in the parallel circuit sets (81), so as to provide the bias voltages required by the respective N parallel circuit sets (81).

The generated reference current in the fifth embodiment has a current value of $(I_1+(N-1)I_2)/N$. If, in each parallel circuit sets (81), the number of first reference elements (811) increases, in turn, the number of second reference elements (812) decreases, the generated reference current values are $(2I_1+(N-2)I_2)/N$, $(3I_1+(N-3)I_2)/N$, . . . , and $((N-1)I_1+I_2)/N$, in sequence. According to these N−1 different reference current values, N different logic states of data may be interpreted.

Figure 9:
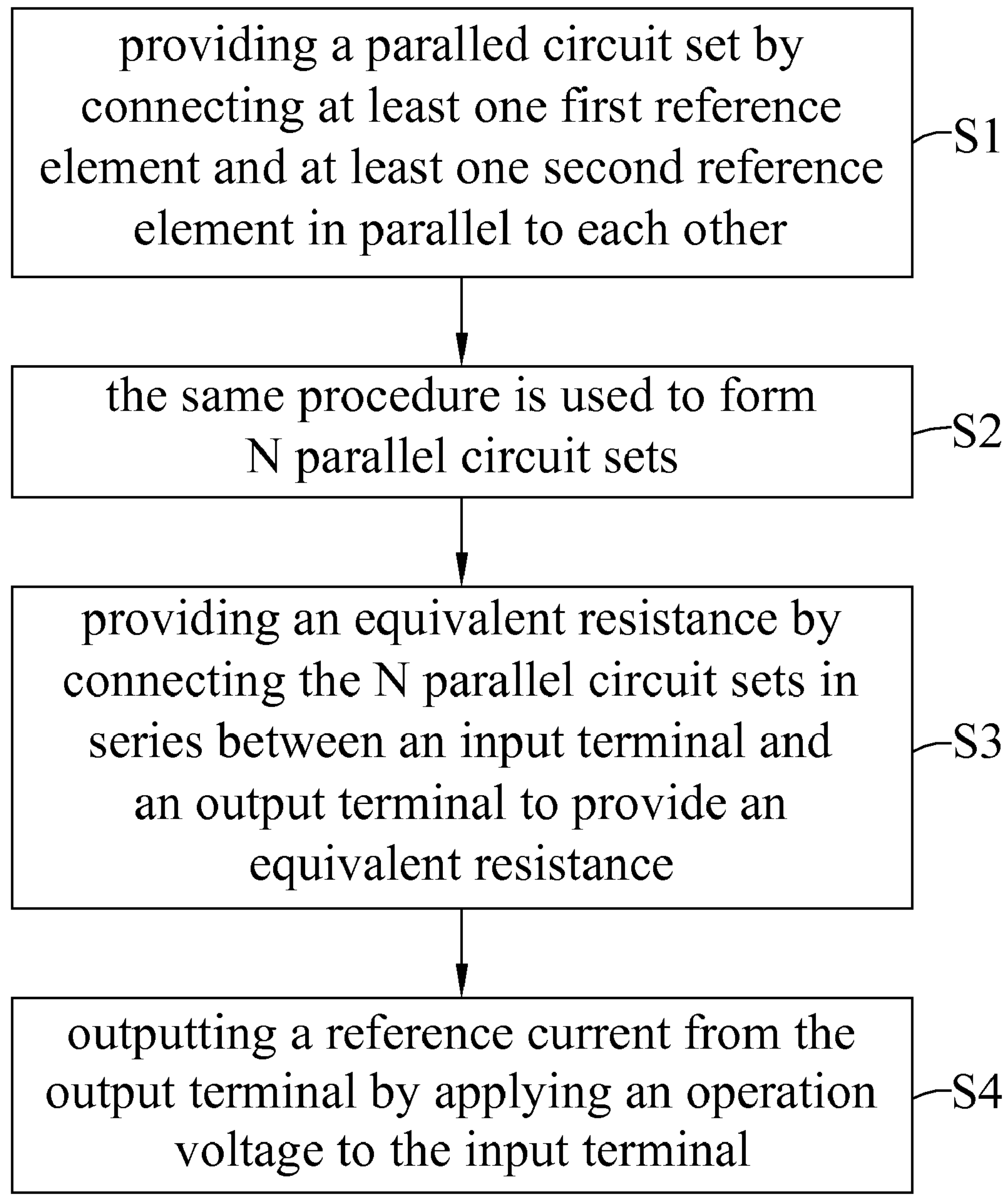
FIG. 9 is a flow chart of the implementation steps of a method for generating a reference current for a resistance type memory according to the present invention.

Referring to FIG. 9, illustrated is a flow chart of the implementation steps of a method for generating a reference current for a resistance type memory according to the present invention. In this figure, the generation method comprises the following steps. In step S1, providing a parallel circuit set by connecting at least one first reference element and at least one second reference element in parallel to each other. In step S2, the same procedure is used to form N parallel circuit sets. In step S3, providing an equivalent resistance by connecting the N parallel circuit sets in series between an input terminal and an output terminal to provide an equivalent resistance. In step S4, outputting a reference current from the output terminal by applying an operation voltage to the input terminal.

In each parallel circuit sets, the number of the first reference elements plus the number of the second reference elements is N.

The resistance value of each of the first reference elements is a first resistance value. The resistance value of each of the second reference elements is a second resistance value different from the first resistance value.

The equivalent resistance value is between the first resistance value and the second resistance value.

Referring to FIG. 3, the first embodiment of the present invention is taken as an example. A first reference element (311) and a second reference element (312) are connected in parallel with each other to provide a parallel circuit set (31). The same procedure is used to form another parallel circuit set (31). These two parallel circuit set (31) are connected in series between an input terminal (32) and an output terminal (33) to provide an equivalent resistance. An operation voltage is applied to the input terminal (32) so that the output terminal (33) outputs a reference current.

The resistance value of each of the first reference elements is a first resistance value. The resistance value of each of the second reference elements is a second resistance value. The first resistance value is not equal to the second resistance value.

The equivalent resistance value is between the first resistance value and the second resistance value.

The above description is illustrative only and is not to be considered limiting. Various modifications or changes can be made without departing from the spirit and scope of the invention. All such equivalent modifications and changes shall be included within the scope of the appended claims.

What is claimed is:

1. A reference current generator for a resistance type memory, comprising:

N parallel circuit sets, where N is an integer greater than 1, each of the N parallel circuit sets being formed with at least one first reference element and at least one second reference element connected in parallel to each other, and the number of the first reference elements plus the number of the second reference elements being N in each of the N parallel circuit sets, and each of the first reference elements being provided with a first resistance value and each of the second reference elements being provided with a second resistance value different from the first resistance value; and N control terminals, each of the N control terminals respectively connected to a gate of a switching transistor of each of the first reference elements and each of the second reference elements in each of the N parallel circuit sets to provide N bias voltages correspondingly;

wherein the N parallel circuit sets are connected in series between an input terminal and an output terminal to form an equivalent resistance provided with a equivalent resistance value between the first resistance value and the second resistance value, and a reference current is outputted from the output terminal by applying an operation voltage to the input terminal;

wherein each of the first reference elements is formed with a non-volatile resistance element and the switching transistor connected in series to the non-volatile resistance element, and each of the second reference elements is formed with the non-volatile resistance element and the switching transistor connected in series to the non-volatile resistance element.

2. The reference current generator for a resistance type memory of claim 1, wherein voltage values of each of the N bias voltages are the same.

3. The reference current generator for a resistance type memory of claim 1, wherein voltage values of each of the bias voltages are different from each other.

4. The reference current generator for a resistance type memory of claim 1, wherein a first reference current is generated by applying the operation voltage to the first reference element; a second reference current is generated by applying the operation voltage to the second reference element, and when the number of the first reference elements is equal to the number of the second reference elements, the reference current is a midpoint current, that is, the reference current is a half of the sum of the first reference current and the second reference current.

5. A method for generating a reference current for a resistance type memory, comprising the following steps:

providing a parallel circuit set by connecting at least one first reference element and at least one second reference element in parallel to each other;

repeating the above procedure to form N parallel circuit sets;

forming an equivalent resistance by connecting the N parallel circuit sets in series between an input terminal and an output terminal;

outputting a reference current from the output terminal by applying an operation voltage to the input terminal; and providing N control terminals, each of the N control terminals respectively connected to a gate of a switching transistor of each of the first reference elements and the each of the second reference elements in each of the N parallel circuit sets to provide N bias voltages correspondingly;

wherein the number of the first reference elements plus the number of the second reference elements is N in each of the N parallel circuit sets;

wherein each of the first reference elements is provided with a first resistance value and each of the second reference elements is provided with a second resistance value different from the second resistance value;

wherein a equivalent resistance value is between the first resistance value and the second resistance value;

wherein each of the first reference elements is formed with a non-volatile resistance element and the switching transistor connected in series to the non-volatile element, and each of the second reference elements is formed with the non-volatile resistance element and the switching transistor connected in series to the non-volatile resistance element.

6. The method for generating a reference current for a resistance type memory of claim 5, wherein voltage values of each of the N bias voltages are the same.

7. The method for generating a reference current for a resistance type memory of claim 5, wherein voltage values of each of the bias voltages are different from each other.

8. The method for generating a reference current for a resistance type memory of in claim 5, wherein a first reference current is generated by applying the operation voltage to the first reference element; a second reference current is generated by applying the operation voltage to the second reference element, and when the number of the first reference elements is equal to the number of the second reference elements, the reference current is a midpoint current, that is, the reference current is a half of the sum of the first reference current and the second reference current.

* * * * *